(12) United States Patent
Shen et al.

(10) Patent No.: US 7,888,160 B2
(45) Date of Patent: Feb. 15, 2011

(54) PROCESS OF MANUFACTURING SOLAR CELL

(75) Inventors: Chang Hong Shen, Hsinchu (TW); Pei Ting Lo, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 259 days.

(21) Appl. No.: 12/314,468

(22) Filed: Dec. 11, 2008

(65) Prior Publication Data
US 2010/0015750 A1    Jan. 21, 2010

(30) Foreign Application Priority Data
Jul. 15, 2008    (TW) .............................. 97126792 A

(51) Int. Cl.
*H01L 21/00*    (2006.01)
(52) U.S. Cl. .......... 438/72; 257/E27.124; 257/E27.125; 257/E27.126; 257/E25.007; 257/E25.009
(58) Field of Classification Search .................. 438/72, 438/166; 257/E27.124–E27.126, E25.007, 257/E25.009; 136/252–258
See application file for complete search history.

(56) References Cited

U.S. PATENT DOCUMENTS 7,052,943 B2 *    5/2006    Yamazaki et al. ........... 438/166

\* cited by examiner

*Primary Examiner*—Davienne Monbleau
*Assistant Examiner*—Monica D Harrison
(74) *Attorney, Agent, or Firm*—Bacon & Thomas, PLLC

(57) ABSTRACT

A process of manufacturing a solar cell is disclosed. The process comprises steps of (a) providing a semiconductor substrate, (b) forming a dielectric layer with amorphous silicon structure on the semiconductor substrate, (c) partially removing the dielectric layer with amorphous silicon structure to expose parts of the semiconductor substrate, (d) simultaneously forming a heavily doped region on a surface of the exposed semiconductor substrate and a lightly doped region on a surface of the unexposed semiconductor substrate using the dielectric layer with amorphous silicon structure as a translucent barrier layer, (e) removing the dielectric layer with amorphous silicon structure, (f) forming an anti-reflection coating on the semiconductor substrate, and (g) forming a first electrode on the anti-reflection coating and coupled with the heavily doped region.

19 Claims, 6 Drawing Sheets

PROCESS OF MANUFACTURING SOLAR CELL

FIELD OF THE INVENTION

The present invention relates to a process of manufacturing a solar cell, and more particularly to a process of manufacturing a solar cell having selective emitters.

BACKGROUND OF THE INVENTION

Recently, the ecological problems resulted from fossil fuels such as petroleum and coal have been greatly aware all over the world. Consequently, there are growing demands on clean energy. Among various alternative energy sources, a solar cell is expected to replace fossil fuels as a new energy source because it provides clean energy without depletion and is easily handled. A solar cell is a device that converts light energy into electrical energy. The procedure of turning solar energy into electrical energy is called the photovoltaic (PV) effect.

Hereinafter, a conventional process of manufacturing a solar cell is illustrated as follows with reference to FIGS. 1A~1H.

First of all, as shown in FIG. 1A, a p-type semiconductor substrate 10 is provided. Then, concave and convex patterns with a minute pyramidal shape called as a texture are formed on the surface of the semiconductor substrate 10 in order to improve light absorption and reduce light reflectivity. The texture structure is very minute and thus not shown in FIG. 1A.

Next, as shown in FIG. 1B, an n-type dopant source diffuses into the substrate by thermal diffusion at high temperature, thereby forming an emitter layer 11 on the light-receiving side S1 and a p-n junction interface between the p-type semiconductor substrate 10 and the emitter layer 11. At the same time, a phosphorus silicate glass (PSG) layer 12 is formed on the emitter layer 11.

Next, as shown in FIG. 1C, the PSG layer 12 is removed to expose the emitter layer 11 by an etching procedure. Then, an anti-reflective coating (ARC) 13, which is made of for example silicon nitride (SiN), is formed on the emitter layer 11 in order to reduce light reflectivity and protect the emitter layer 11, as shown in FIG. 1D.

Next, as shown in FIG. 1E, the ARC 13 is selectively removed to expose parts of the emitter layer 11 by an etching procedure. Then, a second thermal diffusion is implemented to form heavily doped n+ semiconductor regions 11' on the exposed emitter layer 11, as shown in FIG. 1F. Meanwhile, a PSG layer 14 is formed on the n+ semiconductor regions 11', and later, the PSG layer 14 is removed by an etching procedure, as shown in FIG. 1G.

Next, an aluminum conductor layer and a silver conductor layer are respectively formed on the back-lighted side S2 and the light-receiving side S1 by screen printing. Afterwards, by firing the silver conductor layer, a first electrode 15 is formed on the light-receiving side S1. Similarly, by firing the aluminum conductor layer, a back surface field (BSF) layer 16 and a second electrode 17 are formed on the back-lighted side S2, as shown in FIG. 1H, thereby completing the solar cell.

The above process forms a solar cell having selective emitters, wherein the solar cell includes emitters that are formed in different regions and have different doped concentrations and different diffusion depths. For example, the heavily doped n+ semiconductor regions 11' are formed under the first electrodes 15 on the light-receiving side S1, and the n− semiconductor regions 11 are formed on other regions, as shown in FIG. 1H. Since the selective emitters have two different kinds of doped regions, the contact resistance between the first electrodes and the emitters can be reduced, and the electron-hole recombination rate on the surface of the solar cell can also be reduced, so as to increase the blue absorption and the photo-electric conversion efficiency of the solar cell.

The above conventional process of manufacturing the solar cell having selective emitters needs two thermal diffusion procedures to form the lightly doped regions and the heavily doped regions, respectively. However, the high temperature procedure of the thermal diffusion easily causes damage to the semiconductor structure and increases heat consumption.

In views of the above-described disadvantages resulted from the conventional process, the applicant keeps on carving unflaggingly to develop a process of manufacturing a solar cell through wholehearted experience and research.

SUMMARY OF THE INVENTION

The present invention provides a process of manufacturing a solar cell, which utilizes a single thermal diffusion procedure to form a solar cell having selective emitters, so as to prevent the damage to the semiconductor structure from multiple thermal diffusion procedures and reduce the heat consumption.

In accordance with an aspect of the present invention, there is provided a process of manufacturing a solar cell. The process comprises steps of (a) providing a semiconductor substrate, (b) forming a dielectric layer with amorphous silicon structure on the semiconductor substrate, (c) partially removing the dielectric layer with amorphous silicon structure to expose parts of the semiconductor substrate, (d) simultaneously forming a heavily doped region on a surface of the exposed semiconductor substrate and a lightly doped region on a surface of the unexposed semiconductor substrate using the dielectric layer with amorphous silicon structure as a translucent barrier layer, (e) removing the dielectric layer with amorphous silicon structure, (f) forming an anti-reflection coating on the semiconductor substrate, and (g) forming a first electrode on the anti-reflection coating and coupled with the heavily doped region.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Hereinafter, a process of manufacturing a solar cell according to a preferred embodiment of the present invention will be illustrated as follows with reference to FIGS. 2A~2H.

Figure 1A:
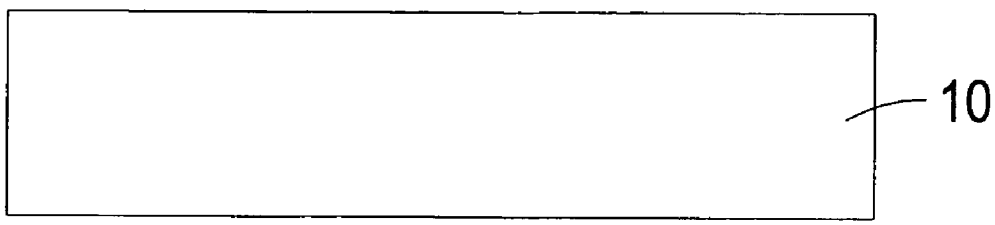
FIGS. 1A~1H are schematic views illustrating a process of manufacturing a solar cell according to prior art.
Figure 1B:
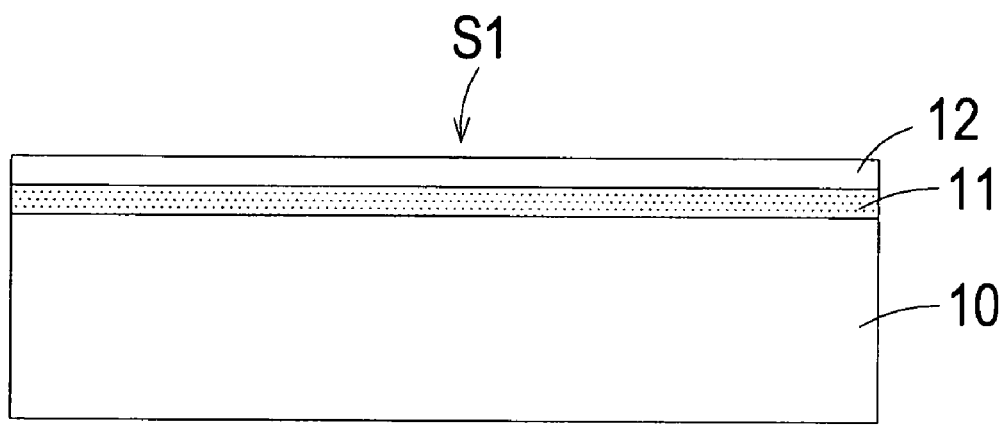
Figure 1C:
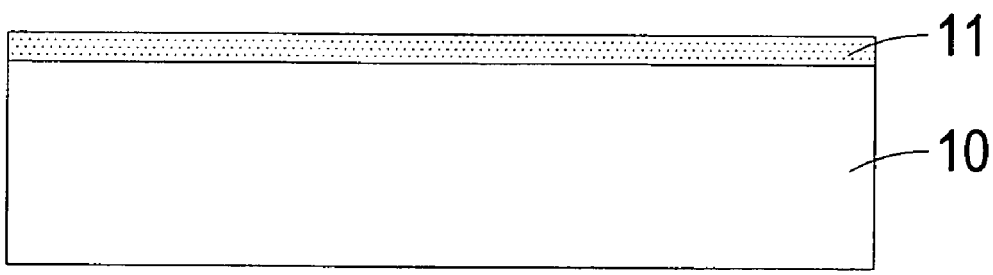
Figure 1D:
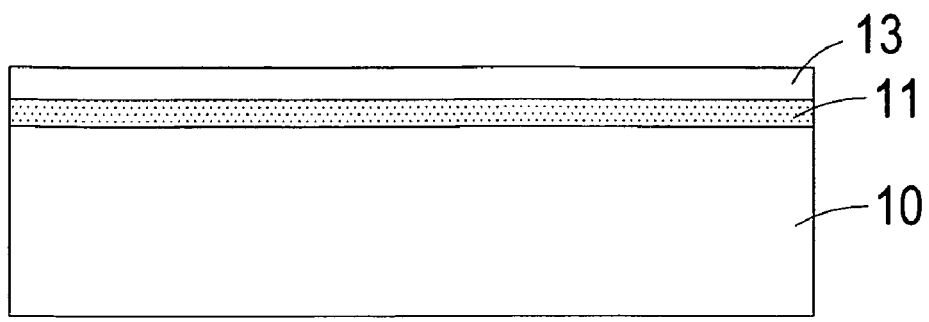
Figure 1E:
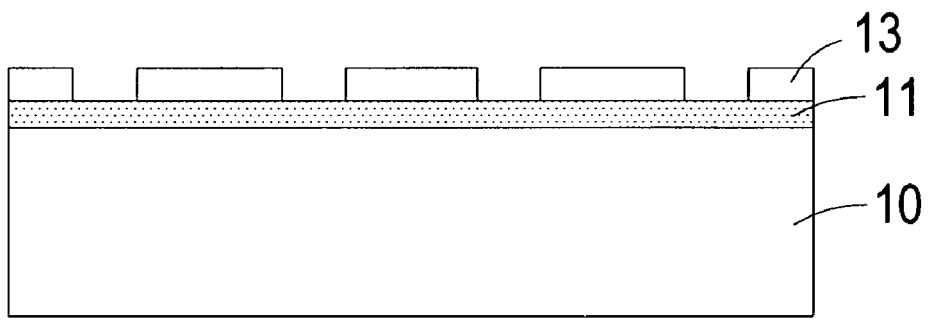
Figure 1F:
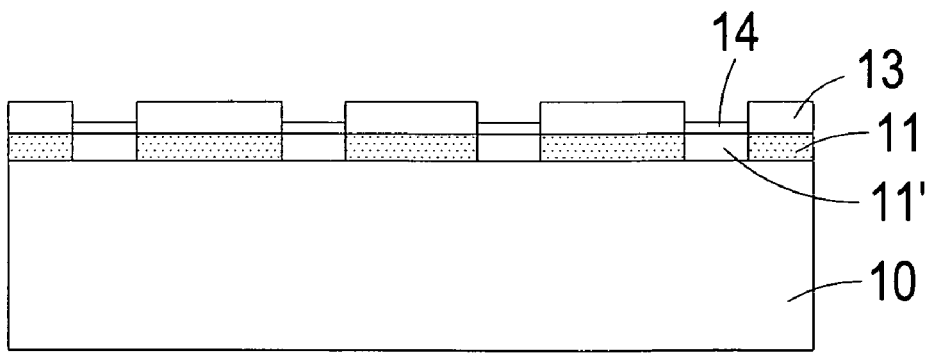
Figure 1G:
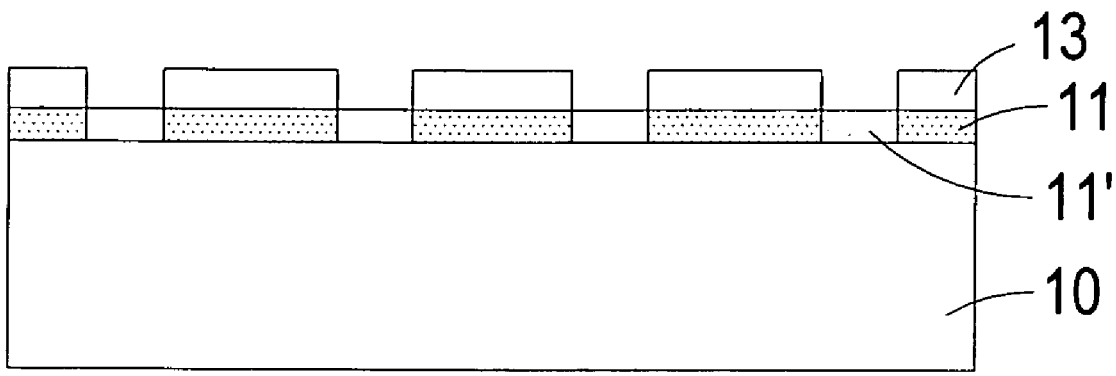
Figure 1H:
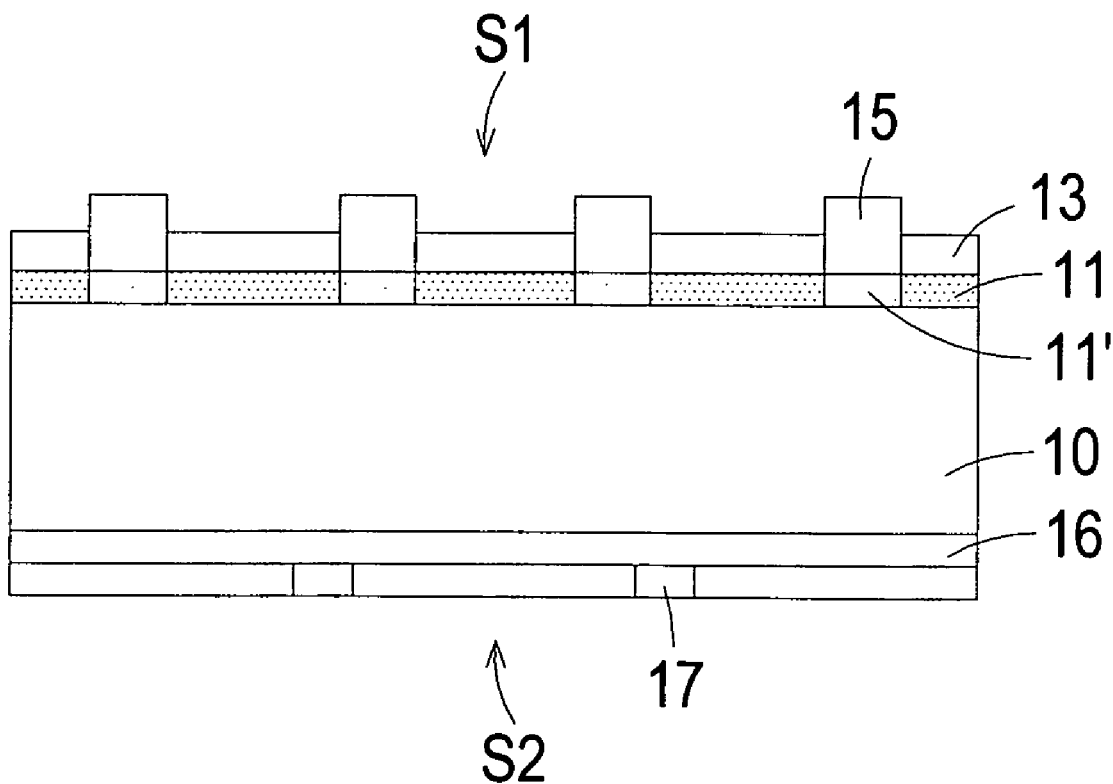
Figure 2A:
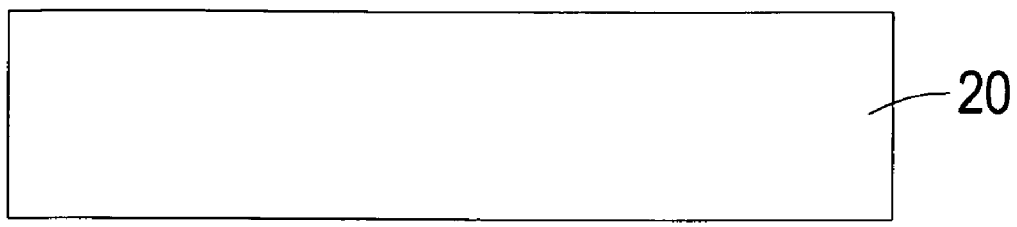
FIGS. 2A~2H are schematic views illustrating a process of manufacturing a solar cell according to a preferred embodiment of the present invention.

First of all, as shown in FIG. 2A, a semiconductor substrate 20 is provided, and then, concave and convex patterns with a minute pyramidal shape called as a texture are formed on the surface of the semiconductor substrate 20 in order to improve light absorption and reduce light reflectivity. The texture structure is very minute and thus not shown in FIG. 2A. In some embodiments, the semiconductor substrate 20 is but not limited to a p-type silicon substrate, and the texture structure of the semiconductor substrate 20 is formed by for example a wet-etching procedure or a reactive ion etching procedure.

Figure 2B:
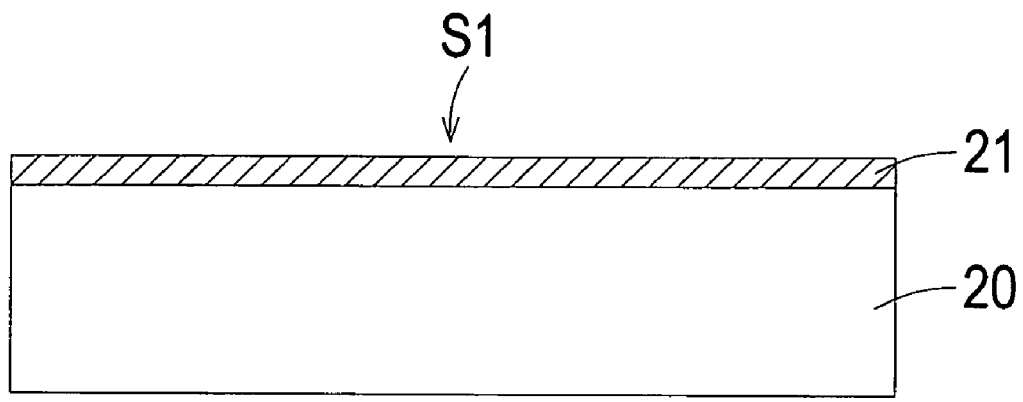
Figure 2C:
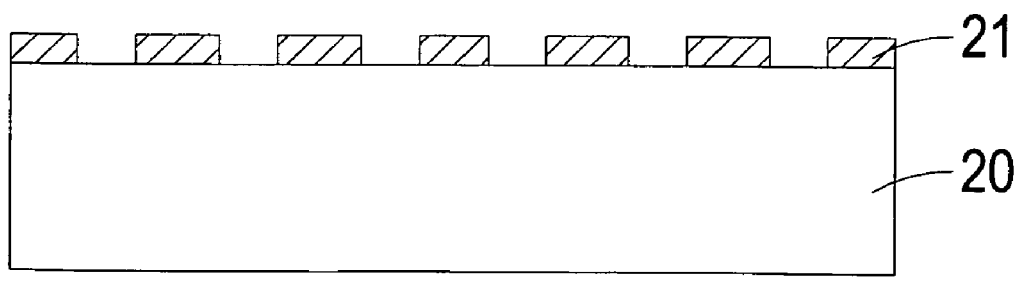

Next, as shown in FIG. 2B, a dielectric layer 21 with amorphous silicon structure is formed on a light-receiving side S1 of the semiconductor substrate 20 by plasma enhanced chemical vapor deposition (PECVD), wherein the dielectric layer 21 with amorphous silicon structure has a thickness of about 10-90 nm. In some embodiments, the dielectric layer 21 with amorphous silicon structure is but not limited to be made of silicon oxide (SiOx), titanium dioxide ($TiO_2$), silicon nitride (SiNx) or silicon oxynitride (SiOxNy). Then, as shown in FIG. 2C, parts of the dielectric layer 21 with amorphous silicon structure are removed to expose parts of the semiconductor substrate 20 by, for example, an etching procedure or a laser heating procedure.

Figure 2D:
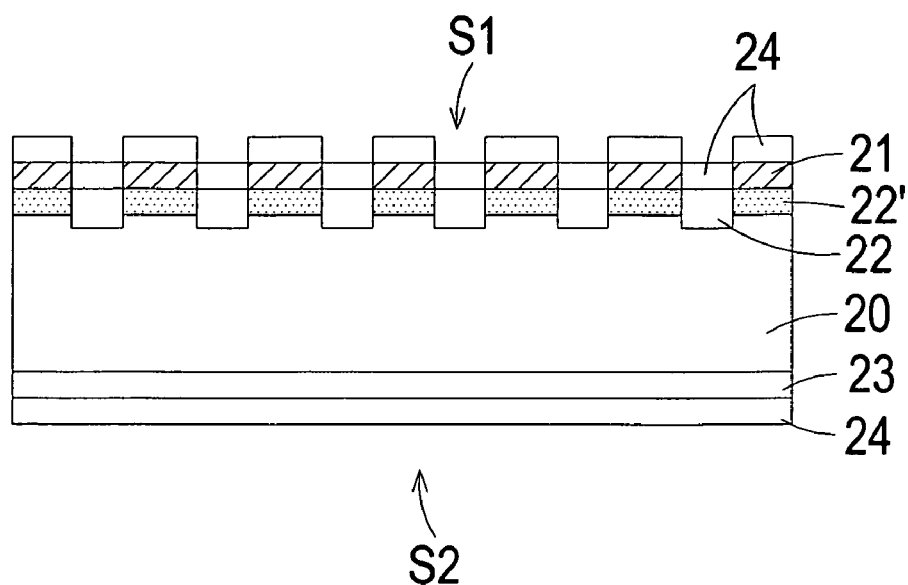

Next, the above resulted semiconductor structure is put into a furnace for thermal diffusion using phosphorus chloride oxide ($POCl_3$) as an n-type dopant source, so as to form plural heavily doped n+ regions 22 on the surface of the exposed semiconductor substrate; in the meantime, the dielectric layer 21 with amorphous silicon structure is served as a translucent barrier layer, so that plural lightly doped n− region 22' are simultaneously formed on the surface of the unexposed semiconductor substrate, which is under the dielectric layer 21 with amorphous silicon structure, while the plural heavily doped n+ regions 22 are formed on the surface of the exposed semiconductor substrate, as shown in FIG. 2D. Therefore, during this single thermal diffusion procedure, the heavily doped emitters and the lightly doped emitters are simultaneously formed, wherein the heavily doped n+ regions 22 are served as emitter contact regions of the solar cell. In addition, a heavily doped n+ emitter layer 23 is also formed on the surface of the semiconductor substrate 20 at the back-lighted side S2; moreover, a phosphorus silicate glass (PSG) layer 24 is formed on the surface of the whole semiconductor structure on both the light-receiving side S1 and the back-lighted side S2 during the thermal diffusion procedure.

Figure 2E:
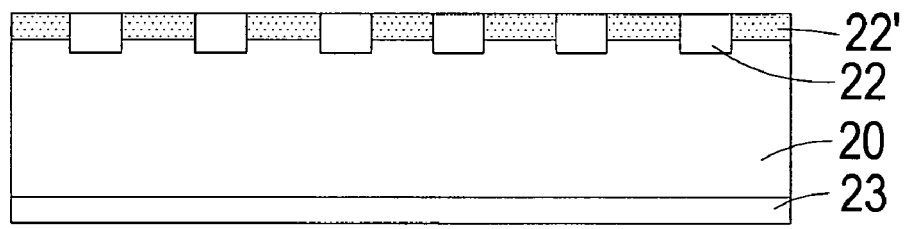
Figure 2F:
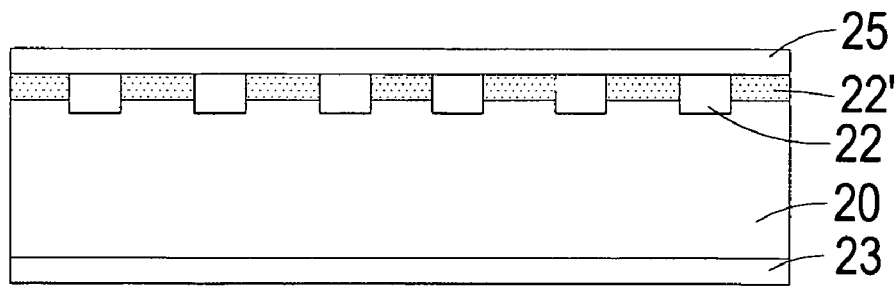

Next, as shown in FIG. 2E, the PSG layer 24 and the dielectric layer 21 with amorphous silicon structure are removed by an etching procedure. In an embodiment, the etching procedure is but not limited to hydrogen fluoride (HF) dip, and both the PSG layer 24 and the dielectric layer 21 with amorphous silicon structure can be easily removed by HF dip.

Next, an anti-reflective coating (ARC) 25 is formed on the emitter layer on the light-receiving side S1 including the heavily doped n+ region 22 and the lightly doped n− region 22' by for example chemical vapor deposition, thereby reducing light reflectivity and protecting the emitter layer. In an embodiment, the anti-reflective coating 25 is made of but not limited to silicon nitride, silicon oxide, titanium dioxide, zinc oxide, tin oxide, or magnesium dioxide. In addition, the anti-reflective coating 25 may be formed by other procedure such as plasma chemical vapor deposition or vacuum evaporation.

Figure 2G:
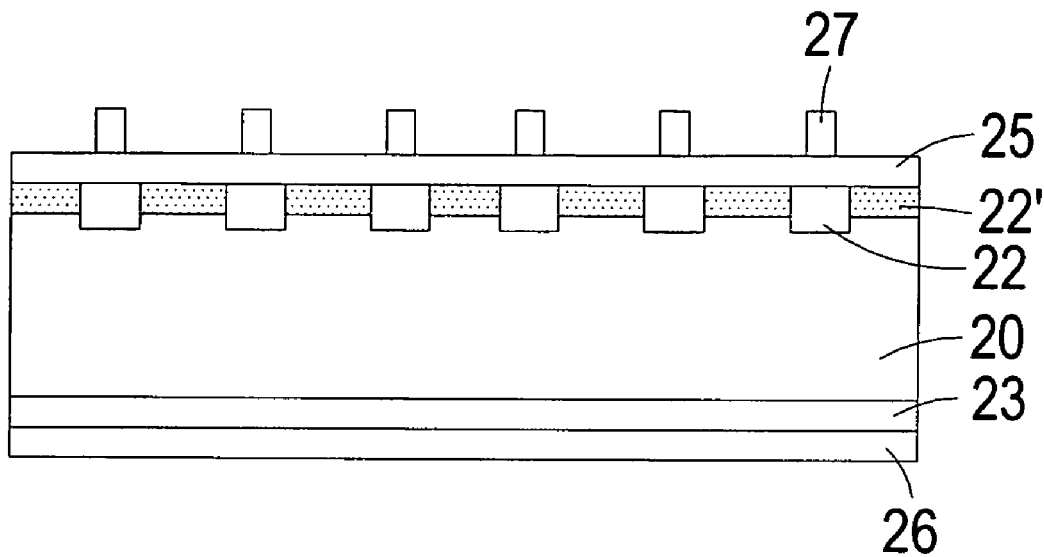

Next, as shown in FIG. 2G, a first conductor 26 is formed on the back-lighted side S2, wherein the first conductor 26 is made of for example aluminum. Then plural second conductors 27 are formed on the light-receiving side S1 by screen printing, wherein the second conductor 27 is made of for example silver. While the second conductors 27 are formed on the anti-reflective coating 25, a predetermined electrode pattern may be aligned with the emitter contact regions (i.e. the heavily doped n+ regions 22), by using an alignment tool.

Figure 2H:
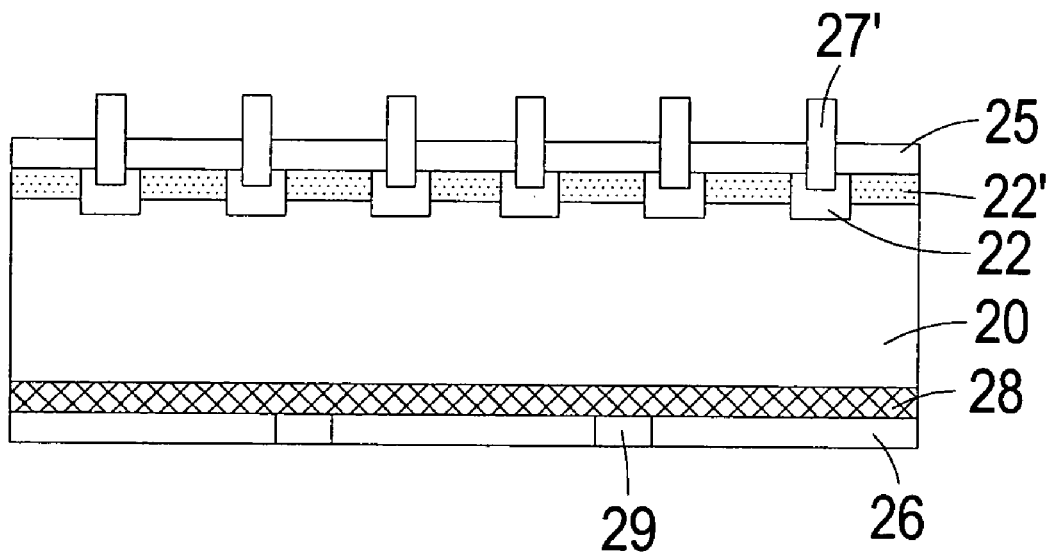

Next, as shown in FIG. 2H, a firing procedure is implemented to the second conductors 27 to form first electrodes 27' on the light-receiving side S1, wherein the first electrodes 27' are extended to corresponding emitter contact regions (i.e. the heavily doped n+ regions 22) through the anti-reflective coating 25. Due to the heat transmitted from the first conductor 26, the emitter layer 23 at the back-lighted side S2 and a portion of the semiconductor substrate 20 are changed to a back surface field (BSF) layer 28 and a portion of the first conductor 26 is changed to a second electrode 29, thereby completing the solar cell.

From the above description, the process of manufacturing the solar cell provided by the present invention utilizes the dielectric layer with amorphous silicon structure as a translucent barrier layer during the thermal diffusion procedure, so that the lightly doped emitter can be formed on the surface of the semiconductor substrate which is under the dielectric layer with amorphous silicon structure, and the heavily doped n+ emitter can be formed on the surface of the semiconductor substrate which is not covered by the dielectric layer with amorphous silicon structure, thereby simultaneously forming the heavily doped emitters and the lightly doped emitters in the single thermal diffusion procedure. Therefore, the solar cell having selective emitters manufactured by the process of the present invention has lower contact resistance, lower electron-hole recombination rate and better blue absorption, and thus the photo-electric conversion efficiency of the solar cell is enhanced. Moreover, different from the prior art which uses two thermal diffusion procedures, the present invention provides a process of manufacturing a solar cell which utilizes only one single thermal diffusion procedure to form the selective emitters of the solar cell, which reduces the damage to the semiconductor structure from the thermal diffusion procedure and reduce the heat consumption, and further increases the yield of the solar cell and decreases the manufacturing cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process of manufacturing a solar cell, comprising steps of:
  (a) providing a semiconductor substrate;
  (b) forming a dielectric layer with amorphous silicon structure on said semiconductor substrate;
  (c) partially removing said dielectric layer with amorphous silicon structure to expose parts of said semiconductor substrate;
  (d) simultaneously forming a heavily doped region on a surface of exposed said semiconductor substrate and a lightly doped region on a surface of unexposed said semiconductor substrate using said dielectric layer with amorphous silicon structure as a translucent barrier layer;
  (e) removing said dielectric layer with amorphous silicon structure;

(f) forming an anti-reflection coating on said semiconductor substrate; and (g) forming a first electrode on said anti-reflection coating and coupled with said heavily doped region.

2. The process according to claim 1 wherein said semiconductor substrate is a p-type silicon substrate.

3. The process according to claim 1 wherein said step (a) further comprises a step of forming a texture structure having concave and convex patterns on said surface of said semiconductor substrate.

4. The process according to claim 3 wherein said step of forming said texture structure is implemented by a wet-etching procedure or a reactive ion etching procedure.

5. The process according to claim 1 wherein said step (b) is implemented by plasma enhanced chemical vapor deposition (PECVD).

6. The process according to claim 1 wherein said dielectric layer with amorphous silicon structure has a thickness of 10-90 nm.

7. The process according to claim 1 wherein said dielectric layer with amorphous silicon structure is made of silicon oxide (SiOx), titanium dioxide ($TiO_2$), silicon nitride (SiNx) or silicon oxynitride (SiOxNy).

8. The process according to claim 1 wherein said step (c) is implemented by an etching procedure or a laser heating procedure.

9. The process according to claim 1 wherein said step (d) uses phosphorus chloride oxide ($POCl_3$) as a dopant source.

10. The process according to claim 1 wherein said heavily doped region is an n+ semiconductor region and said lightly doped region is an n− semiconductor region.

11. The process according to claim 1 wherein said heavily doped region is an emitter contact region.

12. The process according to claim 1 wherein said step (d) further comprises steps of:
(d1) forming a heavily doped emitter layer on a surface of said semiconductor substrate at a back-lighted side; and
(d2) forming a phosphorus silicate glass (PSG) layer on above resulted structure at both light-receiving side and back-lighted side.

13. The process according to claim 12 wherein said step (e) further comprises a step of removing said phosphorus silicate glass (PSG) layer.

14. The process according to claim 1 wherein said step (e) is implemented by hydrogen fluoride (HF) dip.

15. The process according to claim 1 wherein said anti-reflective coating is made of silicon nitride, silicon oxide, titanium dioxide, zinc oxide, tin oxide, or magnesium dioxide.

16. The process according to claim 1 wherein said step (f) is implemented by chemical vapor deposition, plasma chemical vapor deposition or vacuum evaporation.

17. The process according to claim 1 wherein said step (g) further comprises steps of:
(g1) forming a first conductor on a back-lighted side of said semiconductor substrate and forming a second conductor on said anti-reflection coating;
(g2) firing said second conductor into said first electrode, forming a back surface field layer on said back-lighted side, and changing a portion of said first conductor into a second electrode.

18. The process according to claim 17 wherein said first electrode is made of silver.

19. The process according to claim 17 wherein said second electrode is made of aluminum.

* * * * *